(12) United States Patent
Kajii (10) Patent No.: US 7,607,559 B2
(45) Date of Patent: Oct. 27, 2009

(54) CONDUCTIVE BALL ARRAYING APPARATUS

(75) Inventor: Yoshihisa Kajii, Ishikawa (JP)

(73) Assignee: Shibuya Kogyo Co., Ltd., Ishikawa-Ken (JP)

( * ) Notice: Subject to any disclaimer, the term of this patent is extended or adjusted under 35 U.S.C. 154(b) by 0 days.

(21) Appl. No.: 11/987,804

(22) Filed: Dec. 4, 2007

(65) Prior Publication Data

US 2008/0302856 A1 Dec. 11, 2008

(30) Foreign Application Priority Data

Jun. 6, 2007 (JP) ............................ P2007-150250

(51) Int. Cl.
*B23K 3/06* (2006.01)
(52) U.S. Cl. ........................... 228/41; 228/33; 228/245; 228/246
(58) Field of Classification Search .................... 228/33, 228/39, 41, 245, 246, 180.22; 438/612, 613
See application file for complete search history.

(56) References Cited

U.S. PATENT DOCUMENTS 5,655,704 A * 8/1997 Sakemi et al. ................ 228/246

6,253,992 B1 * 7/2001 Fjelstad ....................... 228/245

FOREIGN PATENT DOCUMENTS

| JP | 3271482 | 1/2002 |
| JP | 2006-303341 | 11/2006 |

* cited by examiner

*Primary Examiner*—Jessica L Ward
*Assistant Examiner*—Kevin E Yoon
(74) *Attorney, Agent, or Firm*—Drinker Biddle & Reath LLP (57) ABSTRACT

A conductive ball arraying apparatus includes an arraying jig including conductive ball insertion parts in a predetermined array pattern, a ball cup that has an opening formed in a bottom surface thereof and is capable of housing a plurality of conductive balls along with the arraying jig, moving means that moves the arraying jig and the ball cup relatively, the moving means moving the ball cup relatively along a top surface of the arraying jig and dropping off the conductive balls into the ball insertion parts of the arraying jig, floating means that floats the ball cup from the arraying jig, and vibrating means that vibrates the ball cup. The moving means moves the ball cup relatively along the top surface of the arraying jig while floating the ball cup from the arraying jig and vibrating the ball cup.

8 Claims, 7 Drawing Sheets

CONDUCTIVE BALL ARRAYING APPARATUS

This application claims priority from Japanese Patent Application No. 2007-150250 filed on Jun. 6, 2007, the entire subject matter of which is incorporated herein by reference.

BACKGROUND OF THE INVENTION

1. Field of the Invention

The present invention relates to an improvement of an apparatus for arraying conductive balls by allowing a ball cup housing the conductive balls to relatively move over an arraying jig in which ball insertion parts are formed in a predetermined pattern. More particularly, the invention relates to a conductive ball arraying apparatus designed not to stagnate conductive balls coming in contact with an inner wall surface of a ball cup by floating and vibrating the ball cup relative to an arraying jig. Still more particularly, the invention relates to a conductive ball arraying apparatus designed to easily detect or prevent the biting between a ball cup and an arraying jig by floating the ball cup relative to the arraying jig.

2. Description of the Related Art

In a solder ball mounting apparatus that mounts solder balls on electrodes formed in a predetermined array pattern on a mounting object, the solder balls have been decreased in size and mounting objects such as wafers have been increased in size, thereby enhancing the number of solder balls to be mounted at a time. In this situation, in order to reduce defects in arraying or mounting the solder balls, JP-A-2006-303341 discloses an apparatus for providing an arraying jig such as an array mask on a wafer as a mounting object on which a flux is printed and directly dropping the solder balls onto the electrodes on the wafer while allowing the ball cup to move over the arraying jig.

However, in such a kind of conductive ball array apparatus, since the solder balls close to the lower end of the inner wall surface contacting the rear side of the ball cup in the moving direction do not move and stay and is affected by the gravity, the solder balls may settle down into through holes of the array mask to be broken or deformed, thereby causing a defective product. The broken pieces of the solder balls may cause a defect of another product.

In order to reduce the defects in arraying or mounting the solder balls, Japanese Patent No. 3271482 discloses an apparatus that directly drops the solder balls on electrodes of an electronic substrate by providing an arraying jig (template in Japanese Patent No. 3271482) such as an array mask on the electronic substrate as a mounting object on which a flux is printed and allowing a ball cup (solder ball housing part in Japanese Patent No. 3271482) to move over the arraying jig.

However, in such a kind of conductive ball arraying apparatus, when a tension of the arraying jig is not proper, when the plane precision is failed, or when the height of the ball cup relative to the arraying jig is not properly set, the conductive balls in the ball cup may be bitten between the ball cup and the arraying jig during the ball arraying operation.

When the biting occurs and the moving speed of the ball cup is too high, the solder balls may be broken. It could be considered to reduce the moving speed of the ball cup. However, if the moving speed of the ball cup is reduced, productivity may be decreased. Accordingly, the moving speed of the ball cup should be set properly. However, in an apparatus in which the ball cup moves fixed to moving means at a predetermined height, it is difficult to detect the biting of the solder balls of which a biting load is very small.

SUMMARY OF THE INVENTION

Aspects of the invention provide a conductive ball arraying apparatus that does not stagnate conductive balls coming in contact with an inner wall surface of a ball cup by floating and vibrating the ball cup in the conductive ball arraying apparatus.

Further, aspects of the invention provide a conductive ball arraying apparatus that can easily detect the biting of conductive balls between a ball cup and an arraying jig and prevent the biting by floating the ball cup in the conductive ball arraying apparatus.

According to a first aspect of the invention, there is provided a conductive ball arraying apparatus including: an arraying jig including conductive ball insertion parts in a predetermined array pattern; a ball cup that has an opening formed in a bottom surface thereof and is capable of housing a plurality of conductive balls along with the arraying jig; moving means that moves the arraying jig and the ball cup relatively, the moving means moving the ball cup relatively along a top surface of the arraying jig and dropping off the conductive balls into the ball insertion parts of the arraying jig; floating means that floats the ball cup from the arraying jig; and vibrating means that vibrates the ball cup, wherein the moving means moves the ball cup relatively along the top surface of the arraying jig while floating the ball cup from the arraying jig and vibrating the ball cup.

According to a second aspect of the invention, the floating means ejects air to the top surface of the arraying jig from the bottom surface of the ball cup.

According to a third aspect of the invention, the vibrating means includes a vibrator attached to the ball cup.

According to a fourth aspect of the invention, there is provided a conductive ball arraying apparatus including: an arraying jig including conductive ball insertion parts in a predetermined array pattern; a ball cup that has an opening formed in a bottom surface thereof and is capable of housing a plurality of conductive balls along with the arraying jig; moving means that moves the arraying jig and the ball cup relatively, the moving means moving the ball cup relatively along a top surface of the arraying jig and dropping off the conductive balls into the ball insertion parts of the arraying jig; and an air ejecting hole that ejects air from the bottom surface of the ball cup to the top surface of the arraying jig is formed, wherein the moving means moves the ball cup relatively along the top surface of the arraying jig while floating the ball cup from the arraying jig and vibrating the ball cup by ejecting the air from the air ejection hole.

According to a fifth aspect of the invention, there is provided a conductive ball arraying apparatus including: an arraying jig including conductive ball insertion parts in a predetermined array pattern; a ball cup that has an opening formed in a bottom surface thereof and is capable of housing a plurality of conductive balls along with the arraying jig; moving means that moves the arraying jig and the ball cup relatively, the moving means moving the ball cup relatively along a top surface of the arraying jig and dropping off the conductive balls into the ball insertion parts of the arraying jig; an gas ejection part formed in the bottom surface of the ball cup, wherein the moving means moves the ball cup relatively along the top surface of the arraying jig while floating the ball cup from the arraying jig by ejecting gas from the gas ejection part According to a sixth aspect of the invention, the moving means includes: a cup holder that gives a moving force to the floated ball cup; driving means that moves the cup holder; and guide means that guides the movement of the cup holder, and the ball cup is movably held by the cup holder.

According to a seventh aspect of the invention, the conductive ball arraying apparatus further includes a detector that detects a difference in relative position of the ball cup from the cup holder by the use of a load during the relative movement of the ball cup along the top surface of the arraying jig.

According to an eighth aspect of the invention, the floating gap of the ball cup from the arraying jig is adjusted on the basis of an amount of ejected gas.

According to a ninth aspect of the invention, the moving means moves the ball cup relatively along the top surface of the arraying jig such that the gas ejection part passes through an area other than the insertion portion of the arraying jig.

According to the aspects of the invention, the ball cup floated from the arraying jig is allowed to relatively move along the top surface of the arraying jig while being vibrating. Accordingly, it is possible to prevent the conductive balls coming in contact with the inner wall surface of the ball cup from staying.

Incidentally, according to the fourth aspect of the invention, the gas ejecting hole for ejecting gas from the bottom surface of the ball cup to the top surface of the arraying jig is formed and the ball cup is allowed to relatively move along the top surface of the arraying jig while being vibrated by ejecting the gas from the gas ejection hole. Accordingly, it is possible to provide the floating means and the vibrating means as the same mechanism.

Further, according to the fifth aspect of the invention, the gas ejection part is formed in the bottom surface of the ball cup. Gas is ejected from the gas ejection part to slightly float the ball cup from the arraying jig and to allow the ball cup to relatively move along the top surface of the arraying jig. Accordingly, it is possible to move the ball cup with a very small load.

According to the sixth aspect of the invention, it is possible to reliably float and move the ball cup.

According to the seventh aspect of the invention, it is possible to easily detect the load of the moving ball cup.

According to the eighth aspect of the invention, it is possible to easily adjust the gap between the bottom surface of the ball cup and the arraying jig, thereby preventing the biting of the conductive balls.

According to the ninth aspect of the invention, it is possible to prevent the gas for floating the ball cup from affecting the arrayed conductive balls.

DETAILED DESCRIPTION OF THE PREFERRED EMBODIMENTS

Hereinafter, embodiments of the invention will be described with reference to the drawings. A solder ball mounting apparatus is exemplified in the embodiments. The solder ball mounting apparatus includes a take-in wafer delivery part, a flux printing part, a ball mounting part, and a take-out wafer delivery part.

In the invention, solder balls or platinum balls are used as the conductive balls. A semiconductor wafer (hereinafter, simply referred to as "wafer"), an electronic circuit board, or a ceramic substrate can be used as a conductive ball mounting object. In the embodiments, the solder balls 1 and the wafer 2 are used. A flux, a solder paste, or a conductive adhesive is used as an adhesive material. In the embodiments, the flux 30 is used. The flux 30 is applied in advance to electrodes on the wafer 2 on which the solder balls 1 are mounted.

The ball mounting part in the embodiment includes a wafer mounting table 31 on which the wafer 2 is mounted, a ball cup 4 for supplying the solder balls 1, an array mask 3 for inserting the solder balls 1 in a predetermined array pattern, and a ball cup moving means 5 for allowing the ball cup 4 to move along the top surface of the array mask 3. The wafer mounting table 31 has a lifting mechanism and lifts the wafer 2 at the time of arraying the solder balls 1 so as to keep a predetermined gap between a solder ball mounting surface of the wafer 2 and the lower end surface of the array mask 3.

A through-hole forming area 6 (see FIGS. 1 and 2) is formed at the center of the array mask 3. In the through-hole forming area 6, through holes 7 having a size into which the solder balls 1 are insertable and transmittable are formed in a predetermined array pattern corresponding to the electrodes on the top surface of the wafer 2. Here, the array mask 3 functions as the arraying jig. Further, the through holes 7 function as the insertion portions.

Figure 2:
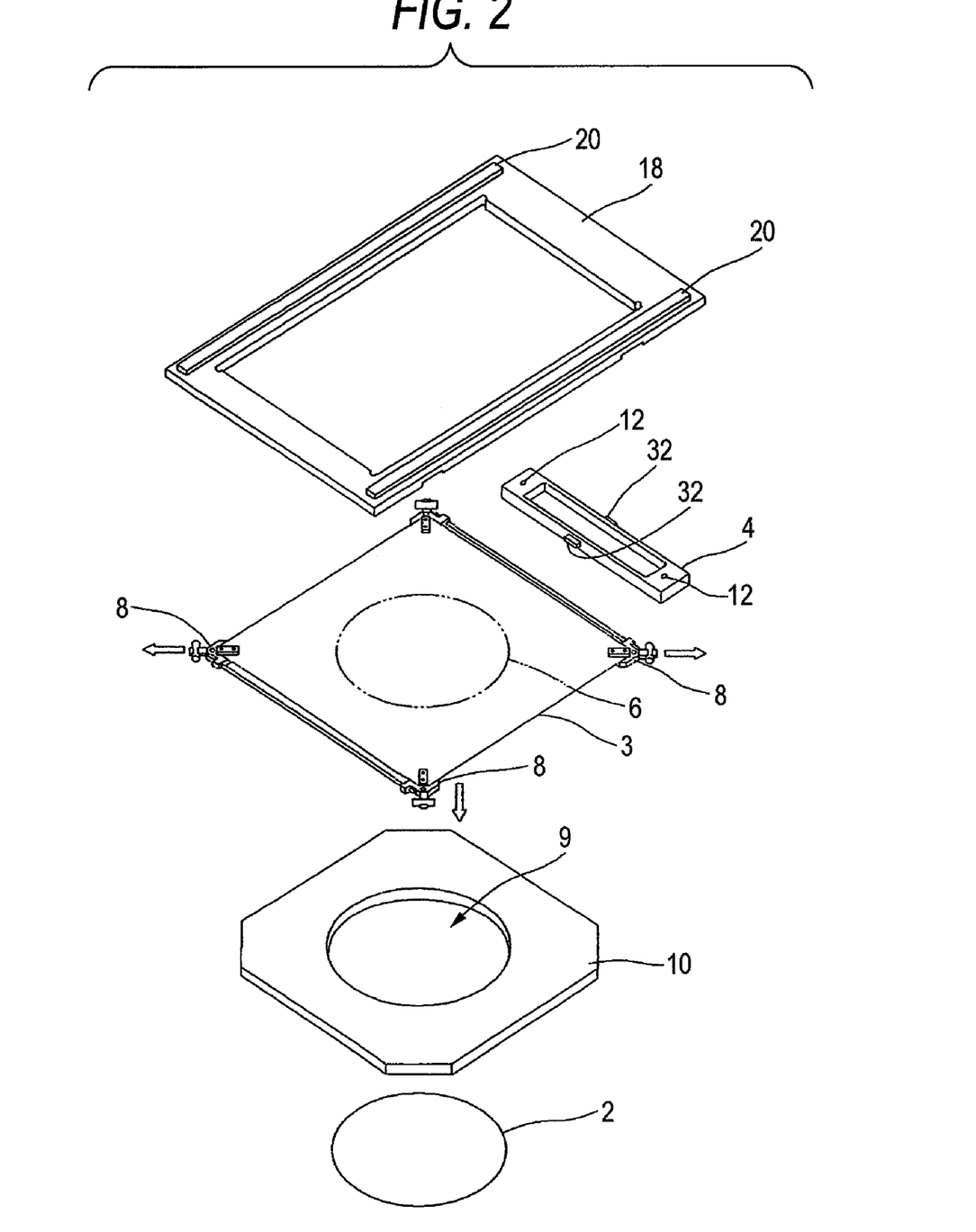
FIG. 2 is an exploded diagram illustrating the ball arraying part.

The array mask 3 of this embodiment has a rectangular shape as shown in FIG. 2. Holding block members 8 for giving a tension to the array mask 3 and enhancing the plane precision of the array mask 3 are attached to four corners of the rectangular array mask 3. The array mask 3 is supported with a tension by an array mask supporting mechanism (not shown) with a proper gap upward from the mounting surface of the solder balls 1 formed on the top surface of the wafer 2.

Figure 4:
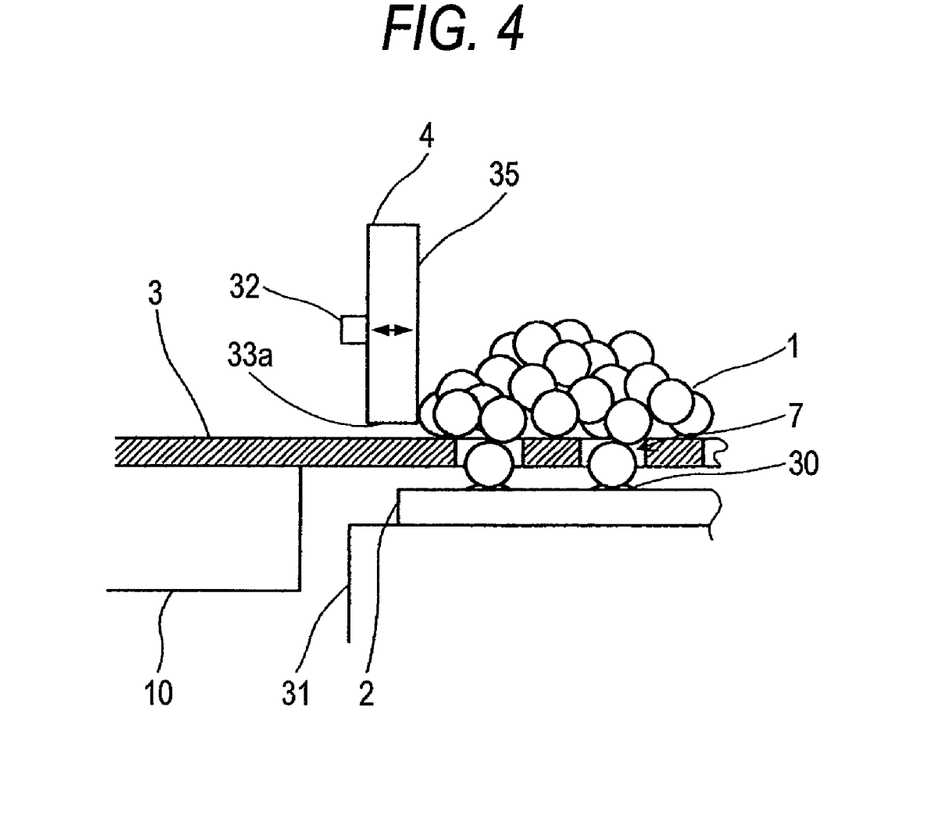
FIG. 4 is a sectional diagram illustrating a vibration direction of the ball cup.
Figure 9:
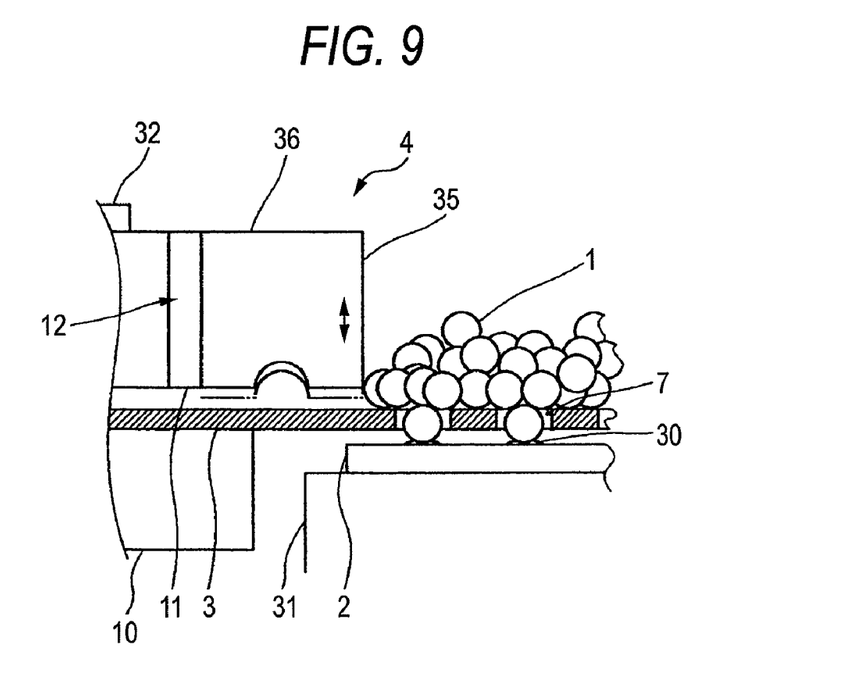
FIG. 9 is a sectional diagram illustrating a case where the upper portions of the inserted solder balls are protruded from the array mask.

The height of the array mask 3 in this embodiment is set so that the top portions of the solder balls 1 inserted into the through holes 7 do not protrude from the top surface of the array mask 3, as shown in FIG. 4. Of course, as shown in FIG. 9, the top portions of the inserted solder balls 1 may protrude from the through holes 7. However, in this case, the bottom portion 33a of the ball cup 4 passing through the through-hole forming area 6 may be set to be higher than the bottom portion 33b passing through an area other than the through-hole forming area 6 in order not to bring the bottom portion 33a of the ball cup 4 into contact with the balls in the through holes 7. The array mask 3 may be brought into contact with the wafer 2. In this case, the diameter of the through holes 7 close to the wafer 2 may be enlarged in order to prevent the flux 30 from being in contact with the array mask 3. Further, a rib or protrusion may be formed on the bottom surface of the array mask 3 in order to prevent the array mask 3 from being hooked to the through holes 7.

As shown in FIG. 2, the array mask supporting mechanism includes a backup plate 10 that is formed of a plate-like stone material having an opening 9 slightly larger than the wafer 2 formed at the center thereof and that is placed to surround the wafer 2 mounted on the wafer mounting table, a backup plate supporting part, and three attracting mechanisms attracting outward or downward the holding block members 8 attached to the array mask 3 and a hooking portion.

The array mask 3 brings the bottom surface thereof into contact with the backup plate 10, fits the holding block members 8 at the corners of the array mask 3 to the hooking portion and the attracting mechanisms, and is attracted slightly downward from the backup plate 10. Accordingly, the array mask 3 comes in close contact with the backup plate 10 with a tension and thus has high plane precision.

The ball cups 4 serving to drop the solder balls 1 into the through holes 7 of the array mask 3 has a ball supply opening formed in the top and a ball dropping opening formed in the bottom. The opening in the bottom has a diameter larger than the width of the through-hole forming area 6 of the array mask 3. The plural solder balls 1 are housed in the ball cup 4 and the top surface of the array mask 3. The ball cup 4 has a width smaller than the width of the array mask 3.

Figure 3:
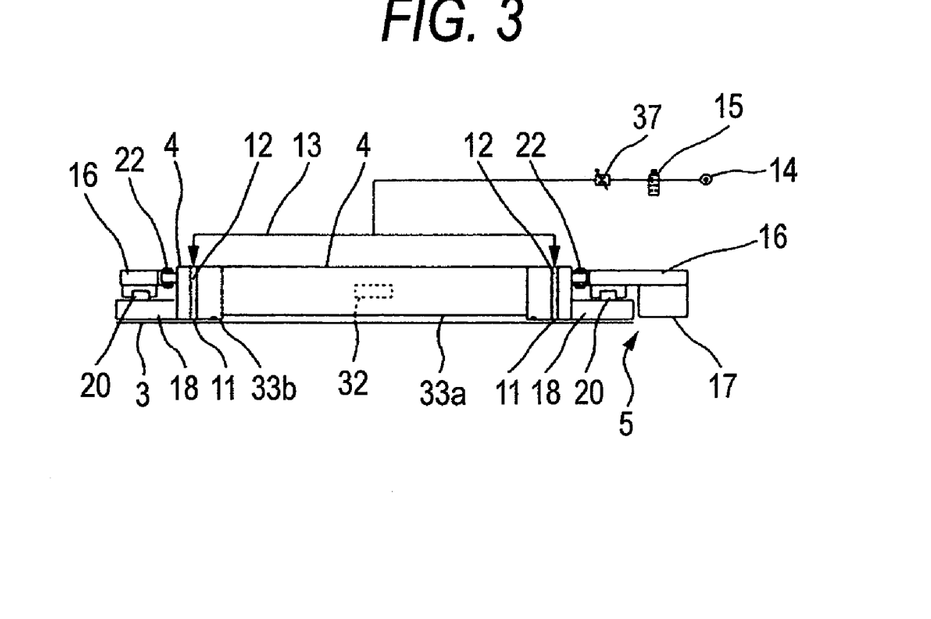
FIG. 3 is a diagram illustrating an air supply to a ball cup.

As shown in FIG. 3, air ejection holes 11 for ejecting air are formed in the vicinity of both ends of the bottom portion 33b of the ball cup 4. The air ejection holes 11 function as the floating means. By ejecting the air from the air ejection holes 11, the ball cup 4 is floated from the array mask 3. Since the air ejection holes 11 are formed in the bottom of the ball cup 4 outside the bottom opening of the ball cup 4, the air ejection holes pass through the area other than the through-hole forming area 6 of the array mask at the time of moving the ball cup 4. Accordingly, the air from the air ejection holes 11 does not affect the solder balls 1 arrayed in the through holes 7 of the array mask 3.

The air ejection holes 11 are connected to the air supply 14 through an air passage 12 inside the ball cup 4 and an air pipe 13 outside the ball cup 4. The ejection of air from the air ejection holes 11 is continuously performed during the operation of the ball cup 4 and the amount of ejected air is constant.

Reference numeral 15 in the way of the air pipe 13 denotes an on-off valve. Reference numeral 37 denotes a throttle valve. By adjusting the throttle valve 37, it is possible to adjust the floating gap of the ball cup 4 from the array mask. The gap between the bottom surface of the ball cup 4 and the top surface of the array mask 3 can be set to a proper gap by this adjustment, thereby preventing the biting or leakage of the solder balls 1.

In a first example of the vibrating means, a piezoelectric actuator 32 is used as a vibrator. The piezoelectric actuators are disposed at the lateral center of the end surfaces in the moving direction (direction indicated by the dotted arrow at the center of FIG. 1) of the ball cup 4 and vibrate the ball cup 4 in the moving direction (direction indicated by the arrow in the ball cup 4 in FIG. 4). When the solder balls 1 come in contact with the inner wall surface of the ball cup 4 into which the solder balls 1 are pushed, the solder balls 1 are bounded from the inner wall surface of the ball cup 4 by means of the vibration. Accordingly, the stagnation of the solder balls 1 can be solved.

The piezoelectric actuator 32 vibrates in an ultrasonic way with an amplitude of 1 μm or less with an application of an AC voltage. The amplitude of this vibration is equal to or smaller than the clearance between the outer width of the ball cup 4 and the inner width of the cup holder 16.

Figure 5:
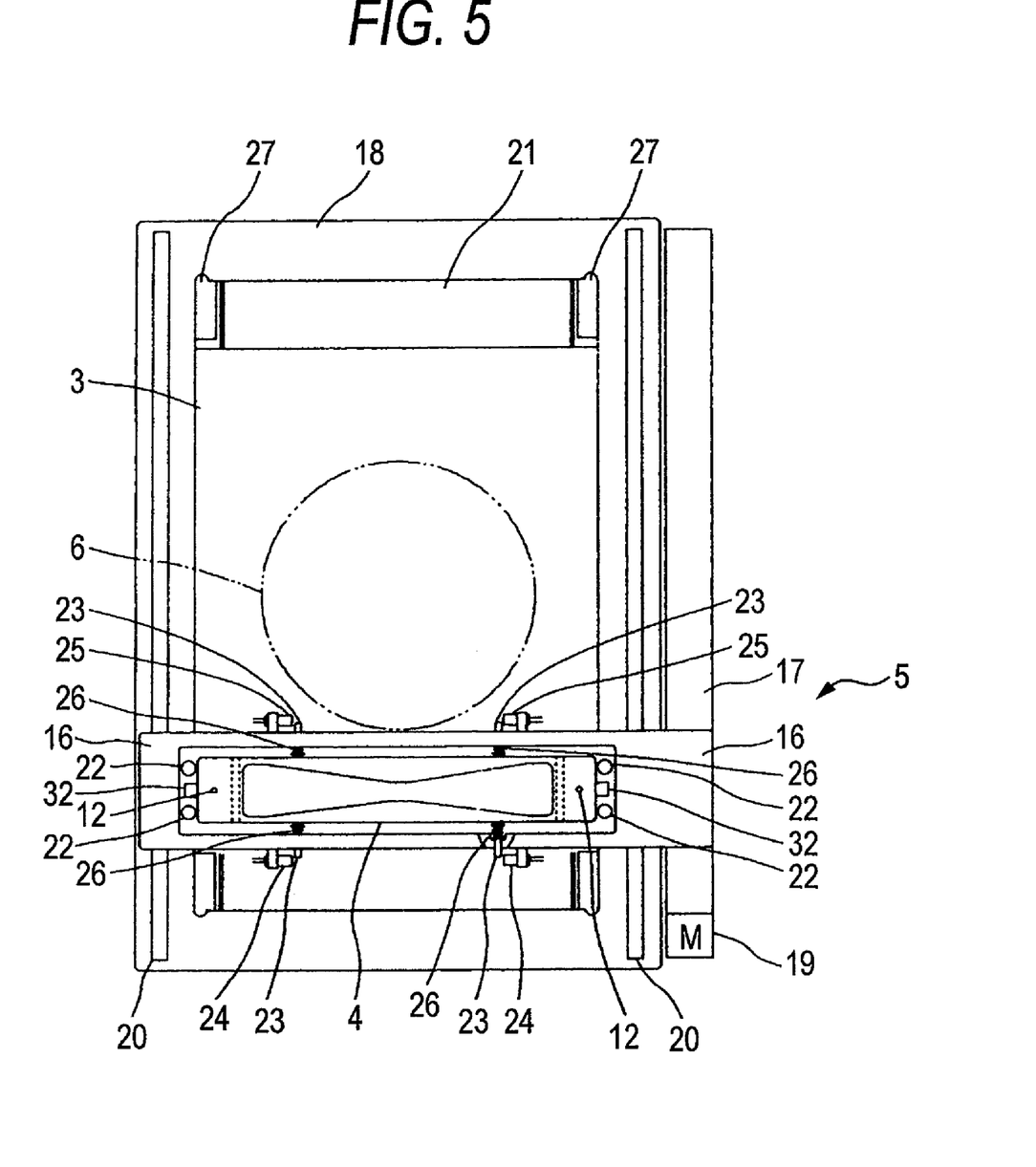
FIG. 5 is a plan view schematically illustrating the ball arraying part in which a vibrator is attached to a side surface thereof.

The attachment positions of the piezoelectric actuators 32 in the first example of the vibrating means are located on the end surfaces in the moving direction of the ball cup 4. However, the piezoelectric actuators may be attached to lateral side wall surfaces in the moving direction of the ball cup 4 as in a second example of the vibrating means shown in FIG. 5. By swelling the wall surface of a ball housing part of the ball cup 4 toward the center, vibration can be transmitted to the solder balls 1 and the collected state of the solder balls 1 can be destructed. Particularly, as shown in FIG. 5, such shape of the wall surface of the ball housing part of the ball cup 4 is effective when the piezoelectric actuators 32 are attached to the lateral side surfaces.

Figure 6:
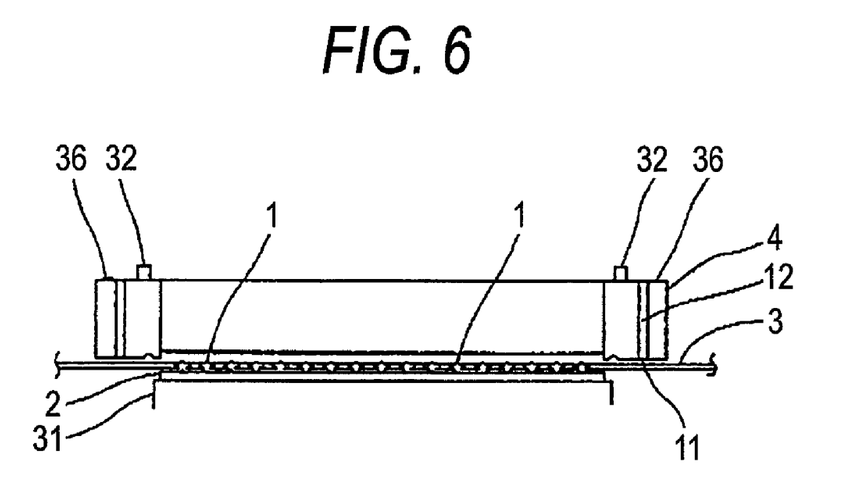
FIG. 6 is a sectional diagram illustrating a state where a vibrator is attached to the top surface of the ball cup.
Figure 7:
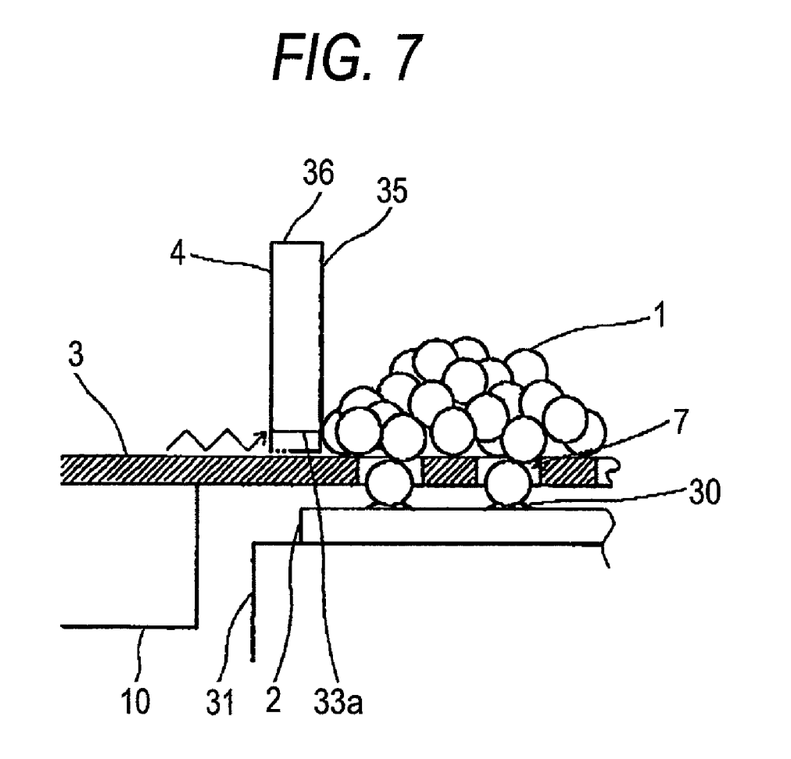
FIG. 7 is a sectional diagram illustrating a vibration of the ball cup.

Two piezoelectric actuators 32 as the vibrator are attached to the left and right top surfaces of the ball cup 4 as in a third example of the vibrating means shown in FIG. 6. In this case, since the piezoelectric actuators 32 give a vertical vibration to the top surface 36 of the ball cup 4, the ball cup 4 is vibrated vertically. The solder balls 1 coming in contact with the inner wall 35 of the ball cup 4 are rotated by means of the vibration. Accordingly, the stagnation of the solder balls 1 can be solved.

Figure 8:
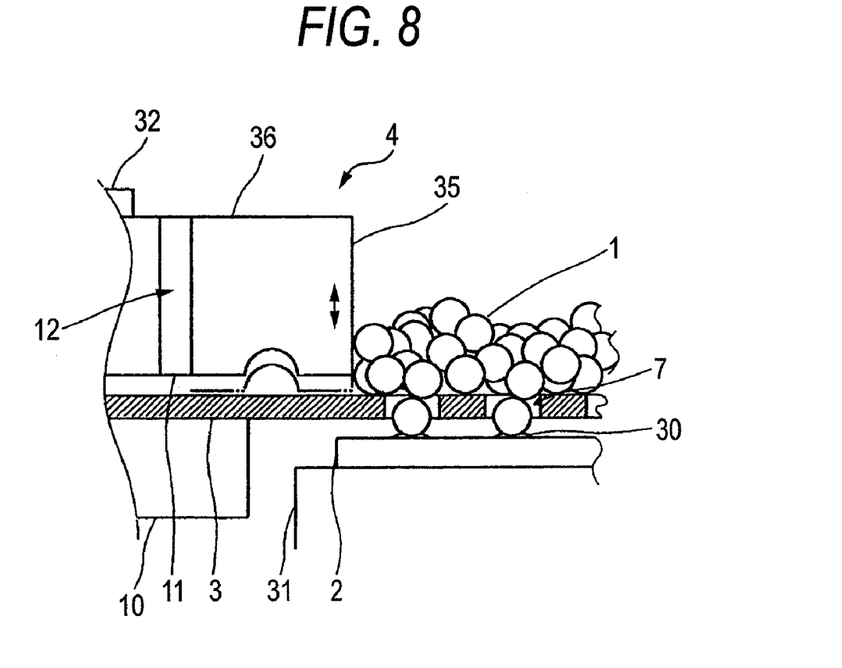
FIG. 8 is a sectional diagram illustrating a case where upper portions of inserted solder balls are kept in an array mask.

In the range of vertical movement of the ball cup 4, the bottom portion 33a of the ball cup 4 is located at a height equal to or less than a radius of the solder balls 1 located on the array mask 3 at a upper limit. Further, the bottom portion 33a of the ball cup 4 is located at a height not interfering with the solder balls 1 inserted into the through holes 7 at a lower limit. Accordingly, the amount of vertical movement of the ball cup 4 due to the vibration is smaller when the top portions of the inserted solder balls 1 protrude from the array mask 3 as shown in FIG. 9 than when the top portions of the inserted solder balls 2 stay inside the array mask 3 as shown in FIG. 8.

A ball cup moving means 5 for moving the ball cup 4 forward and backward includes a cup holder 16 giving a forward-backward moving force the ball cup 4 floated and vibrated, driving means 17 movably driving the cup holder 16, and a guide plate 18 guiding the movement of the cup holder 16.

The driving means 17 serves to move the cup holder 16 holding the ball cup 4 to move forward and backward above the array mask 3 by a ball screw or the like rotated by a driving motor 19. The cup holder 16 is fitted to the driving means 17.

Figure 1:
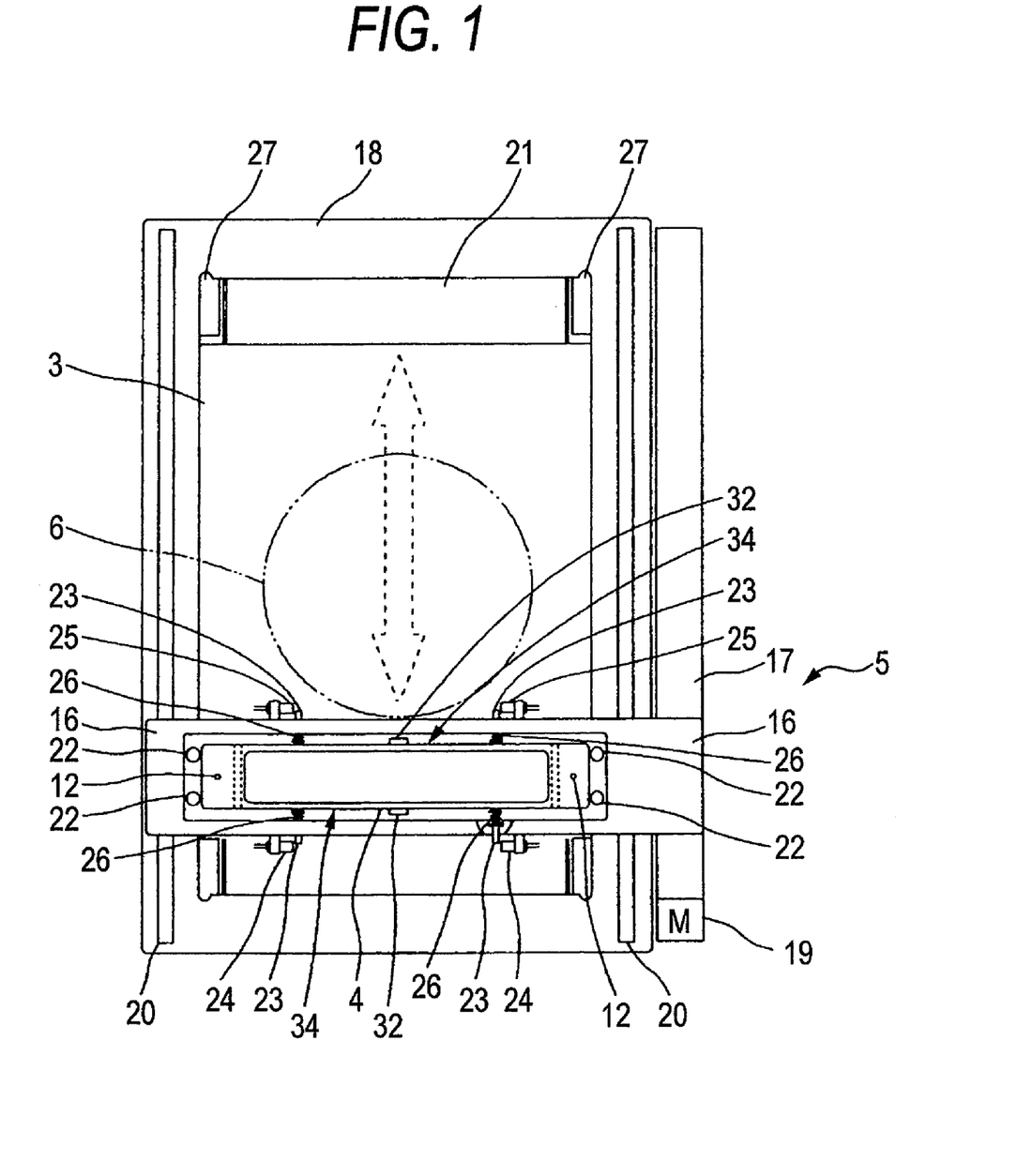
FIG. 1 is a plan view schematically illustrating a ball arraying part of an arraying apparatus.

Reference numeral 18 in FIG. 1 denotes a guide plate having a frame shape surrounding the array mask 3. Guide rails 20 are formed on both sides thereof along the moving direction of the ball cup 4. The cup holder 16 is slidably disposed in the guide rails 20. The cup holder 16 is made to move forward and backward along the guide rails 20 by the driving means 17.

By virtue of this movement, the ball cup 4 moves over the array mask 3 while being floated and vibrated, and drops and arrays the solder balls 1 into the through holes 7 of the array mask 3 from the ball cup 4. The ball cup moving means 5 in this example allows the ball cup to move only forward and backward, but a laterally moving means may be provided as needed.

The guide plate 18 is longer than the array mask 3 in the forward-backward direction. A front end of the guide plate in the forward direction is an empty portion. A ball receiver 21 is disposed below the empty portion. Accordingly, the ball cup 4 stops over the array mask 3 in the front of the ball receiver 21, and is inverted and moved backwardly. In contrast, at the time of replacing the array mask 3, the ball cup 4 moves right above the ball receiver 21 and drops the solder balls 1 onto the ball receiver 21. Reference numeral 27 denotes a cup moving path for supporting the ball cup 4 when the ball cup 4 drops the solder balls onto the ball receiver 21.

The cup holder 16 has an empty portion therein in which the ball cup 4 is disposed. The ball cup 4 is held in the empty portion by a weak force such as a bias of a spring 26 fitted to a slide roller 22 and a load sensing shaft 23. The inside end of the load sensing shaft 23 comes in contact with a side surface of the ball cup 4 with the weak force of the spring 26 in the cup holder 16. The other end of the load sensing shaft 23 protrudes slidably outward from the cup holder 16. Accordingly, when the ball cup 4 moves in a way different from the movement of the cup holder 16, the ball cup 4 presses the load sensing shaft 23.

Outside the cup holder 16, load sensors 24 and 25 for sensing the movement of the load sensing shaft 23 are fitted to the vicinity of the protrusion of the load sensing shaft 23. The load sensor 24 senses the forward movement of the ball cup 4. The load sensor 25 senses the backward movement of the ball cup. A light transmitting and receiving photoelectric sensor is used as the sensors.

When the biting of the solder balls 1 between the bottom of the ball cup 4 and the array mask 3 occurs during the movement of the ball cup 4, the movement of the ball cup 4 is subjected to resistance. For example, when the biting occurs in the right bottom of the ball cup 4 during the forward movement thereof, the left side moves forward normally without any resistance due to the forward force acting on the ball cup 4 from the cup holder 16, but the right side is subjected to the resistance to the normal movement. Accordingly, the right side moves more slowly than the cup holder 15. Then, when the right load sensing shaft 23 in the rear side in the moving direction of the ball cup 4 is pressed to the right of the ball cup 4 and exceeds the biasing force of the spring 26, the shaft is pushed out of the cup holder 16. This is sensed by the right load sensor 24, thereby detecting the biting of the solder balls 1. In this way, the biting of the solder balls 1 is detected as a difference in relative position of the ball cup 4 relative to the cup holder 16 by the load sensor 24 fitted on the rear side in the moving direction of the cup holder 16.

When the moving direction of the ball cup 4 is inverted, the effective load sensor 25 is switched. In this example, the ball cup 4 moves to array the solder balls 1 on the array mask 3. However, in the invention, it is enough as long as the array mask 3 and the ball cup 4 move relative to each other. Accordingly, the same is true when the ball cup 4 is fixed and the array mask 3 is movable. Vibrators may be attached to both end surfaces in the moving direction of the ball cup 4, the top surface, and both side surfaces.

In the first to third examples of the vibrating means, the piezoelectric actuators 32 are used as a vibrator. However, the air ejection holes 11 as the gas ejection hole ejecting the gas to the top surface of the array mask 3 from the bottom surface of the ball cup 4 may be provided as the vibrating means instead of the vibrator, and the air may be ejected from the air ejection holes 11 to vertically vibrate the ball cup 4. When the ball cup 4 is vibrated by the ejection of gas, the vibrating means and the floating means of the ball cup 4 can be combined into one body.

Figure 10:
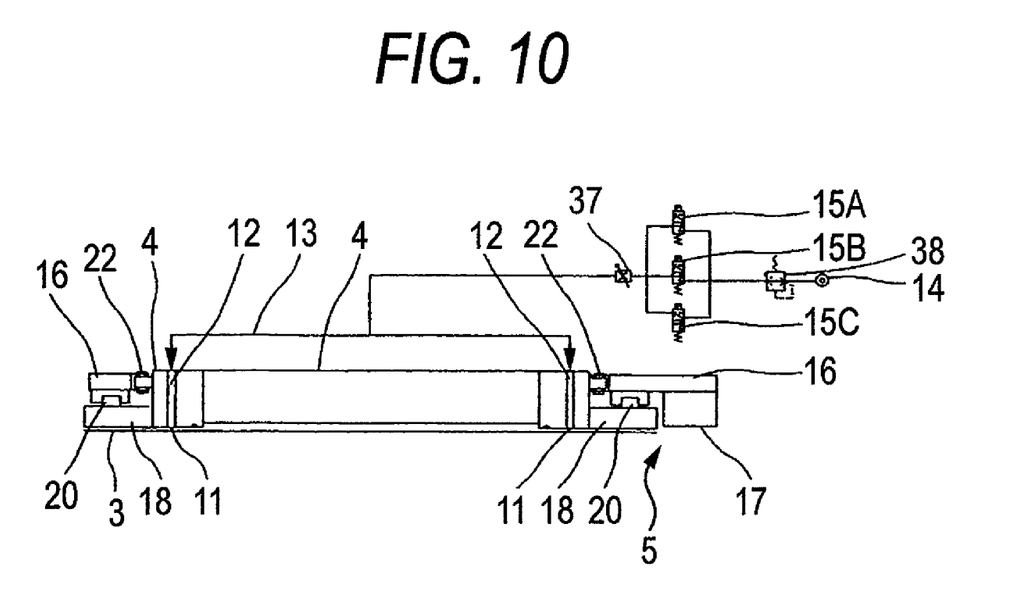
FIG. 10 is a sectional diagram illustrating a case where an ejection and stop of air is used in vibrating means.

In a fourth example of the vibrating means combined with the floating means, the air ejection holes 11 are formed in the vicinity of both sides of the bottom portion 33b of the ball cup 4, the air ejection holes 11 are connected to the air supply 14 through the air passage 12 inside the ball cup 4 and the air pipe 13 outside the ball cup 4, and the on-off valve 15 and the throttle valve 37 are disposed in the way of the air pipe 13. In these aspects, the fourth example of the vibrating means is similar to the floating means. However, in the fourth example of the vibrating means, as shown in FIG. 10, three on-off valves 15A, 15B, and 15C employing an electromagnetic valve are provided in the way of the air pipe 13 connected to the air supply 14 and a regulator 38 is provided between the on-off valves 15A, 15B, and 15C and the air supply 14.

The ejection and stop control operation of the air from the air ejection holes 11 is performed by switching the ON (open) and OFF (closed) states of the on-off valves 15A, 15B and 15C. Since the vibrating means gives the vertical vibration to the ball cup 4, the same upper and lower limit management as the third example of the vibrating means is required. However, in the fourth example of the vibrating means, the upper floating limit of the ball cup 4 is adjusted by the use of the air pressure or the air flow rate and the lower floating limit thereof is adjusted by the use of the switching time of the on-off valves 15A, 15B and 15C.

In a first step of the control procedure, the on-off valve 15A is opened and the on-off valves 15B and 15C are closed. In this state, the ball cup 4 is floated at a predetermined upper limit position. In a second step, the on-off valve 15A is closed and then the on-off valve 15B is opened with a little time gap. At this time, the on-off valve 15C is kept in the closed state. For the little time gap, the ball cup 4 is lowered to the lower limit position and then returns to the upper limit position.

In a third step, the on-off valve 15B is closed and then the on-off valve 15C is opened in a little time gap. At this time, the on-off valve 15A is kept in the closed state. For the little time gap, the ball cup 4 is lowered to the lower limit position and then returns to the upper limit position.

In a fourth step, the on-off valve 15C is closed and then the on-off valve 15A is opened in a little time gap. At this time, the on-off valve 15B is kept in the closed state. For the little time gap, the ball cup 4 is lowered to the lower limit position and then returns to the upper limit position.

Thereafter, by repeating the second to fourth steps, the vertical vibration can be applied to the ball cup 4 in a state where the ball cup 4 is floated. By using an electromagnetic valve in the on-off valves 15A, 15B, and 15C, it is possible to apply 20 vibrations per second. In the fourth example of the vibrating means shown in FIG. 10, the air ejection and stop times from the left and right air ejection holes 11 are equal to each other. However, the air ejection and stop times from the left and right air ejection holes 11 may be different from each other.

In the fourth example of the vibrating means, the set of three on-off valves 15A, 15B and 15C is used. However, the number of on-off valves may be increased or may be reduced to only one on-off valve 15. Particularly, when the number of on-off valves 15A, 15B and 15C is increased, lifetime of the on-off valves may be increased.

In a fifth example of the vibrating means, the on-off valves 15A, 15B and 15C are removed from the fourth example of the vibrating means. By using the fifth example of the vibrating means, the ball cup 4 may be vibrated. When the air is supplied from the air supply 14 to the air ejection holes 11 of the ball cup 4 to float the ball cup 4, the ball cup 4 is lowered by virtue of the gravity of the ball cup 4. When the ball cup 4 is lowered and the gap between the bottom of the ball cup 4 and the top surface of the array mask 7 is reduced, the air pressure in the air ejection holes 11 or the air pipe 13 is enhanced. When the air pressure is enhanced to a certain degree, the air raises the ball cup 4 so as to enhance the gap between the ball cup 4 and the array mask 7 and then the ball cup 4 is lowered again due to the gravity. The vibration of the ball cup 4 results from repeating these steps. In this case, the amplitude and frequency can be changed depending on the throttle valve 37, the gravity adjustment of the ball cup 4, or the bottom shape of the ball cup 4. In the vibration direction, forward and backward components or lateral components may be added to the vertical components.

What is claimed is:

1. A conductive ball arraying apparatus comprising:
an arraying jig including conductive ball insertion parts in a predetermined array pattern;
a ball cup that has an opening formed in a bottom surface thereof and is capable of housing a plurality of conductive balls along with the arraying jig;
moving means that moves the arraying jig and the ball cup relatively, the moving means moving the ball cup relatively along a top surface of the arraying jig and dropping off the conductive balls into the ball insertion parts of the arraying jig;
floating means that floats the ball cup from the arraying jig; and
vibrating means that vibrates the ball cup,
wherein the moving means moves the ball cup relatively along the top surface of the arraying jig while floating the ball cup from the arraying jig and vibrating the ball cup; and
the floating means ejects air to the top surface of the arraying jig from the bottom surface of the ball cup.

2. The conductive ball arraying apparatus according to claim 1, wherein the vibrating means includes a vibrator attached to the ball cup.

3. A conductive ball arraying apparatus comprising:
an arraying jig including conductive ball insertion parts in a predetermined array pattern;
a ball cup that has an opening formed in a bottom surface thereof and is capable of housing a plurality of conductive balls along with the arraying jig;
moving means that moves the arraying jig and the ball cup relatively, the moving means moving the ball cup relatively along a top surface of the arraying jig and dropping off the conductive balls into the ball insertion parts of the arraying jig; and
an air ejecting hole that ejects air from the bottom surface of the ball cup to the top surface of the arraying jig is formed,
wherein the moving means moves the ball cup relatively along the top surface of the arraying jig while floating the ball cup from the arraying jig and vibrating the ball cup by ejecting the air from the air ejection hole.

4. A conductive ball arraying apparatus comprising:
an arraying jig including conductive ball insertion parts in a predetermined array pattern;
a ball cup that has an opening formed in a bottom surface thereof and is capable of housing a plurality of conductive balls along with the arraying jig;
moving means that moves the arraying jig and the ball cup relatively, the moving means moving the ball cup relatively along a top surface of the arraying jig and dropping off the conductive balls into the ball insertion parts of the arraying jig;
a gas ejection part formed in the bottom surface of the ball cup,
wherein the moving means moves the ball cup relatively along the top surface of the arraying jig while floating the ball cup from the arraying jig by ejecting gas from the gas ejection part.

5. The conductive ball arraying apparatus according to claim 4,
wherein the moving means includes:
a cup holder that gives a moving force to the floated ball cup;
driving means that moves the cup holder; and
guide means that guides the movement of the cup holder, and
wherein the ball cup is movably held by the cup holder.

6. The conductive balls arraying apparatus according to claim 5, further comprising:
a detector that detects a difference in relative position of the ball cup from the cup holder by the use of a load during the relative movement of the ball cup along the top surface of the arraying jig.

7. The conductive ball arraying apparatus according to claim 4, wherein the floating gap of the ball cup from the arraying jig is adjusted on the basis of an amount of ejected gas.

8. The conductive ball arraying apparatus according to claim 4, wherein the moving means moves the ball cup relatively along the top surface of the arraying jig such that the gas ejection part passes through an area other than the insertion portion of the arraying jig.

* * * * *